(12) United States Patent
Ryan et al.

(10) Patent No.: US 10,551,415 B2
(45) Date of Patent: *Feb. 4, 2020

(54) LOCKING MECHANISM FOR A FAULTED CIRCUIT INDICATOR

(71) Applicant: Schweitzer Engineering Laboratories, Inc., Pullman, WA (US)

(72) Inventors: Eric Ryan, Spokane, WA (US); Mark A. Thomas, Pullman, WA (US); Mark F. Witczak, Oakwood Hills, IL (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/385,833

(22) Filed: Apr. 16, 2019

(65) Prior Publication Data

US 2019/0277892 A1 Sep. 12, 2019

Related U.S. Application Data

(63) Continuation of application No. 15/914,696, filed on Mar. 7, 2018, now Pat. No. 10,338,108.

(51) Int. Cl.
*G01R 19/165* (2006.01)
*G01R 15/18* (2006.01)
*G01R 1/22* (2006.01)
*H02H 3/04* (2006.01)

(52) U.S. Cl.
CPC ......... *G01R 19/16547* (2013.01); *G01R 1/22* (2013.01); *G01R 15/18* (2013.01); *H02H 3/04* (2013.01)

(58) Field of Classification Search
CPC ...... G01R 1/22; G01R 15/142; G01R 15/186; G01R 15/18; G01R 15/14; G01R 19/25; G01R 31/42; H01F 38/30
See application file for complete search history.

(56) References Cited

U.S. PATENT DOCUMENTS

| | | | | |
|---|---|---|---|---|
| 3,621,392 A | * | 11/1971 | Liebermann | G01R 1/22 324/127 |
| 3,668,747 A | * | 6/1972 | Ockel | A44B 11/2534 24/599.6 |
| 3,795,028 A | * | 3/1974 | Weiss | A44B 11/25 24/191 |
| 4,126,094 A | * | 11/1978 | Zimmerle | B61D 17/16 105/377.11 |
| 4,314,389 A | * | 2/1982 | Sauer | A44C 5/2042 24/376 |
| 4,707,562 A | * | 11/1987 | Whited | H02G 1/02 174/40 R |
| 5,550,476 A | * | 8/1996 | Lau | G01R 15/142 324/509 |

(Continued)

*Primary Examiner* — Hoi C Lau
(74) *Attorney, Agent, or Firm* — Bradley W. Schield

(57) ABSTRACT

The present disclosure relates to systems and methods of locking a faulted circuit indicator (FCI). For example, the FCI may include a locking assembly. The locking assembly may include a lock plate that selectively moves between a locked position and an unlocked position. When in the locked position, the lock plate blocks a lock link of the FCI from moving in a first direction to prevent the FCI from opening. When in an unlocked position, the lock plate enables the lock link of the FCI to move in the first direction to allow the FCI to open.

20 Claims, 9 Drawing Sheets

(56) References Cited

U.S. PATENT DOCUMENTS

| | | | | |
|---|---|---|---|---|
| 5,565,783 A * | 10/1996 | Lau | | G01R 15/142 324/127 |
| 5,656,931 A * | 8/1997 | Lau | | G01R 19/25 324/522 |
| 5,748,095 A * | 5/1998 | Horstmann | | G01R 19/16547 324/133 |
| 5,818,188 A * | 10/1998 | Hirai | | B23Q 1/00 318/480 |
| 5,870,803 A * | 2/1999 | Jorst | | A44B 11/28 24/265 BC |
| 7,106,048 B1 * | 9/2006 | Feight | | G01R 31/42 324/127 |
| 7,347,065 B1 * | 3/2008 | DeGolyer | | A44C 9/0046 63/12 |
| 9,915,680 B2 * | 3/2018 | Khoshnood | | G01R 1/22 |
| 10,338,108 B1 * | 7/2019 | Ryan | | G01R 1/22 |
| 2003/0128133 A1 * | 7/2003 | Thomas | | G01R 15/186 340/854.9 |
| 2006/0237444 A1 * | 10/2006 | Ennis | | G01R 15/18 219/545 |
| 2006/0249411 A1 * | 11/2006 | Gu | | B25H 3/02 206/349 |
| 2007/0086135 A1 * | 4/2007 | Swartzendruber | | H02H 3/04 361/90 |
| 2007/0226958 A1 * | 10/2007 | Clifton, Jr. | | A45F 5/02 24/3.12 |
| 2007/0290835 A1 * | 12/2007 | Engel Hardt | | G01R 15/142 340/538.16 |
| 2008/0246507 A1 * | 10/2008 | Gunn | | H02G 7/00 324/764.01 |
| 2009/0015239 A1 * | 1/2009 | Georgiou | | G01R 15/14 324/105 |
| 2009/0060489 A1 * | 3/2009 | Elias | | G03B 17/566 396/428 |
| 2010/0004688 A1 * | 1/2010 | Maas | | A61B 17/7065 606/248 |
| 2010/0083473 A1 * | 4/2010 | Mieszelewicz | | F16L 41/06 24/279 |
| 2010/0218715 A1 * | 9/2010 | Mies | | G01R 1/22 116/200 |
| 2010/0253318 A1 * | 10/2010 | Thomas, Sr. | | H01F 27/40 323/358 |
| 2010/0284820 A1 * | 11/2010 | Wang | | F04D 25/088 416/244 R |
| 2011/0017232 A1 * | 1/2011 | Junkins | | B08B 11/00 134/6 |
| 2011/0126677 A1 * | 6/2011 | Buchanan | | B25B 13/461 81/60 |
| 2012/0038446 A1 * | 2/2012 | McBee | | H01F 27/06 336/176 |
| 2012/0146661 A1 * | 6/2012 | Thomas | | H01F 38/30 324/542 |
| 2013/0310768 A1 * | 11/2013 | Ebara | | A61M 5/168 604/250 |
| 2014/0050521 A1 * | 2/2014 | Pearce | | A63C 9/003 403/322.4 |
| 2014/0061194 A1 * | 3/2014 | Verheyden | | H04Q 1/025 220/210 |
| 2014/0231307 A1 * | 8/2014 | Wen | | B25H 3/02 206/736 |
| 2014/0343613 A1 * | 11/2014 | Eliasen | | A61B 17/7034 606/278 |
| 2015/0039029 A1 * | 2/2015 | Wade | | A61B 17/0401 606/232 |
| 2015/0123425 A1 * | 5/2015 | Huston | | B62D 33/023 296/183.1 |
| 2015/0293146 A1 * | 10/2015 | Khoshnood | | G01R 1/22 324/756.01 |
| 2018/0051948 A1 * | 2/2018 | Corso | | F41A 9/65 |
| 2018/0087884 A1 * | 3/2018 | Tedder | | F42B 39/02 |
| 2019/0277892 A1 * | 9/2019 | Ryan | | H02H 3/04 |

\* cited by examiner

LOCKING MECHANISM FOR A FAULTED CIRCUIT INDICATOR

RELATED APPLICATION

This application is a continuation of U.S. patent application Ser. No. 15/914,696 filed on Mar. 7, 2018, titled "Locking Mechanism fora Faulted Circuit Indicator" which is herein incorporated in its entirety.

TECHNICAL FIELD

The present disclosure relates to systems and methods for locking faulted circuit indicators (FCIs) in a closed position.

BRIEF DESCRIPTION OF THE DRAWINGS

Non-limiting and non-exhaustive embodiments of the disclosure are described herein, including various embodiments of the disclosure with reference to the figures listed below.

DETAILED DESCRIPTION OF SPECIFIC EMBODIMENTS

Figure 1:
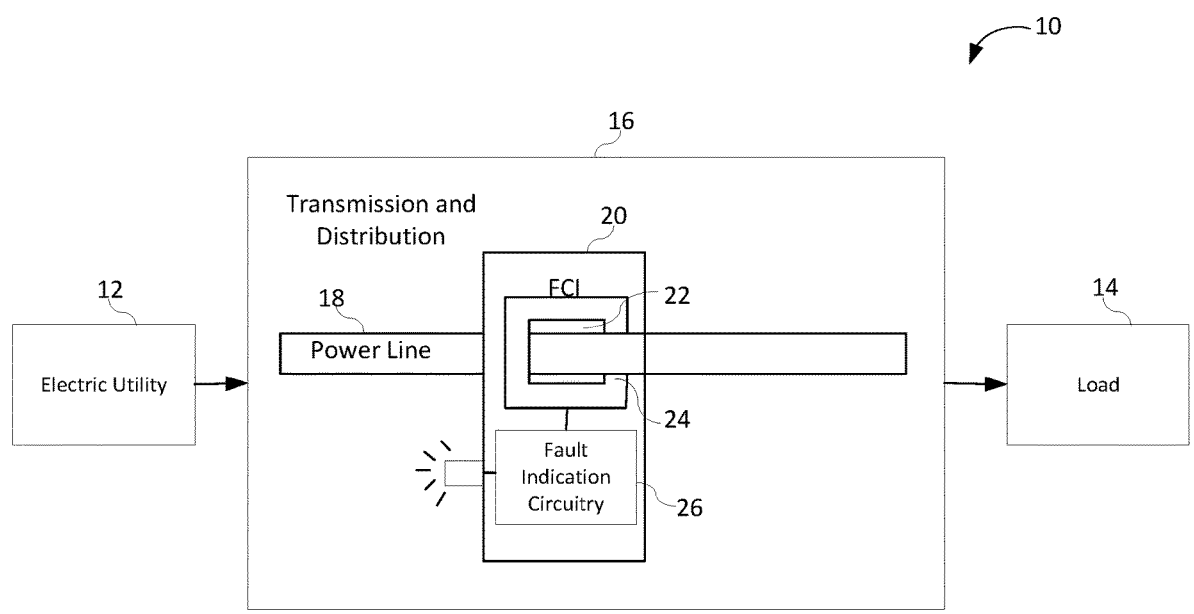
FIG. 1 is a block diagram of a power system having a faulted circuit indicator (FCI) on a power line, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Power lines may be used to provide electrical energy from a source (such as, for example, a utility source, a generator, a distributed generator, or the like) to one or more loads. Power lines may be overhead lines or underground lines that include one or more conductors to conduct electricity between the source and the loads. In some cases, an event, such as an overcurrent, an undercurrent, an undervoltage, an overvoltage, a loss of current, and the like, may occur in which power does not reach the loads in the desired state. For instance, overhead power lines may be subject to various environmental conditions, such as wind, falling trees, lightening, or animals, that cause faults (e.g., persistently or transiently) between the utility and the loads.

Faulted circuit indicators (FCIs) may be used by power operators to detect these faults and identify locations of faults on delivered power system. An FCI may provide an indication that an event has occurred or is occurring on a power line. By identifying the location of the event, the operators may efficiently correct the fault and reduce the amount of time that power is interrupted.

However, FCIs may fall or otherwise be disconnected from the power line. For example, environmental forces (e.g., wind, rain, snow, nature etc.) may cause the power line to "whip" and impart forces on objects attached to the line, such as FCIs. Due to these forces, some FCIs may become disconnected from the power line. As such, the FCIs may not provide indications of events to operators causing, for example, longer delays in locating the events. As such, it is desirable to secure FCIs to power lines to withstand these forces.

As described below, a locking mechanism may lock the FCI in a closed position to secure the FCI to the power line and to prevent the FCI from opening. In various embodiments, the FCI may include a first housing and a second housing. A power line may be inserted between the first housing and the second housing while the FCI is in an open position. The power line may be enclosed between the first housing and the second housing while the FCI is in a closed position. The FCI may include a lock link coupled to the first housing. The locking mechanism may selectively block the lock link from moving in an unlock direction to prevent the first housing and the second housing from moving to the open position while the locking mechanism is in a locked position and allow the lock link to move in the unlock direction while the locking plate is in an unlocked position to enable the first housing and the second housing to transition to the open position.

FIG. 1 is a block diagram of a power system 10 having a source such as, for example, an electric utility 12 that generates power to deliver electrical energy to a load 14 via a transmission and distribution system 16. The transmission and distribution system 16 may include one or more power lines 18, such as overhead power lines. The power line 18 may be any suitable transmission and/or distribution power line. The power system 10 may include a faulted circuit indicator (FCI) assembly 20 that encloses the a portion of power line 18 via an opening 22 and secures the FCI assembly 20 to the portion of the power line 18. The FCI assembly 20 includes current sensor circuitry 24 to measure current through the power line 18. For example, the current sensor circuitry 24 may include a current transformer (CT) having coiled wire to inductively measure alternating current (AC) through the power line. The FCI assembly 20 may include fault indication circuitry 26 that receives a signal from the current sensor circuitry 24 to monitor the power line 18 for events. The fault indication circuitry may provide a signal indicating the occurrence of an event.

Figure 2:
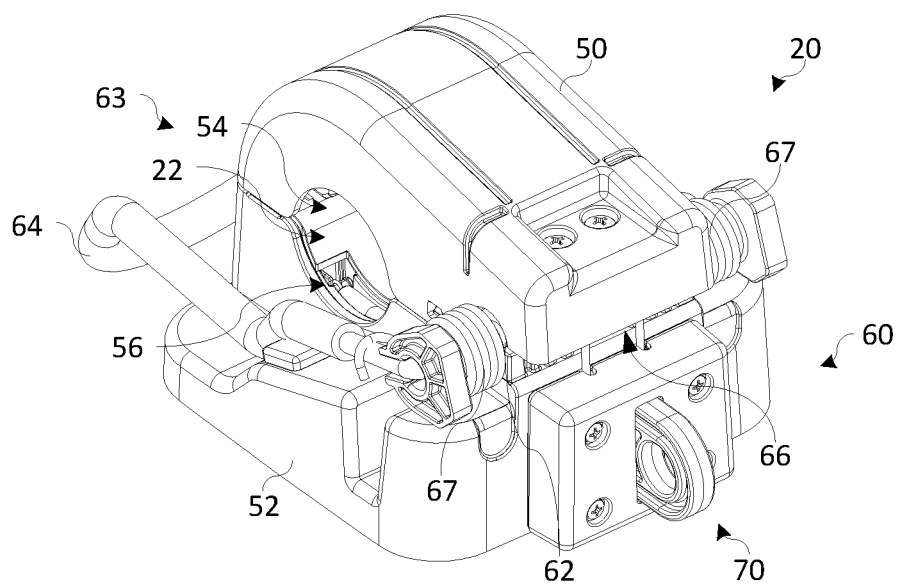
FIG. 2 is a perspective view of the FCI of FIG. 1 having a locking mechanism, in accordance with an embodiment.

FIG. 2 is a perspective view of one embodiment of an FCI assembly 20 that may be used on the power line 18 of FIG. 1. In the illustrated embodiment, the FCI assembly 20 includes a first housing 50 and a second housing 52. While in the closed position, as shown in FIG. 2, the first housing 50 and the second housing 52 form an opening 22 therebetween to enclose a portion of the power line 18. That is, the first housing 50 includes a first portion 54 (e.g., first semi-cylindrical opening) of the opening 22 and the second housing 52 includes a second portion 56 (e.g., second semi-cylindrical opening) of the opening 22. The first portion 54 and the second portion 56 are contoured to form the opening 22 (e.g., cylindrical opening) sized to receive the power line 18. The first housing 50 and the second housing 52 may be rotationally coupled to each other on a first end 60 of the FCI assembly 20 via a hinged connection 62. In other embodiments, the first housing 50 and the lower housing 52 may be linearly coupled or coupled in any other suitable manner. The hinged connection 62 may align a second end 63 of the first housing to the second end 63 of the second housing 52 to position the windings annularly and proximate to the power line 18. The FCI assembly 20 includes a clamp bar 64 that guides the power line 18 as the power line 18 is inserted into the opening 22 when in the open position. The FCI assembly 20 has a torsion spring 66 that biases the first housing 50 and the second housing 52 towards each other to the closed position. That is, forces from the torsion spring 66 maintain the first housing 50 and the second housing 52 in the closed position. Further, a clamp spring 67 or another spring may bias the clamp bar 64 to the closed position via support from the second housing.

As mentioned above, FCIs may decouple from a power line due to various forces on the power line and/or the FCI. For example, wind may move the power line to impart forces on the FCI assembly that exceed the forces holding the FCI to the power line. If the forces holding the FCI to the power line are exceeded, the FCI may open and/or decouple from the power line. In some instances, the FCI assembly may fall from the power line or otherwise may not provide indications of events. Provided herein are embodiments of an FCI including a locking mechanism to improve a connection of the FCI to the power line.

Described below are FCI embodiments that may include a locking mechanism 70 that prevents the FCI assembly 20 from opening. That is, by locking the FCI assembly 20 in the closed position via the locking mechanism 70, the FCI assembly 20 may withstand stronger environmental conditions than FCIs without a locking mechanism. The locking mechanism 70 may maintain the FCI assembly 20 in the closed position under forces that exceed the forces applied by the torsion spring 66. By securing the FCI assembly 20 in the closed position via the locking mechanism 70, the FCI assembly 20 may continue to provide event indications during and following environmental conditions (e.g., strong winds, rain, or snow) that may otherwise cause the FCI assembly 20 to decouple from the power line 18, thereby allowing operators to more quickly and reliably identify events due to the FCI assemblies 20. By more quickly and reliably identifying events, interruptions in power transmission and distribution may be reduced.

Figure 3:
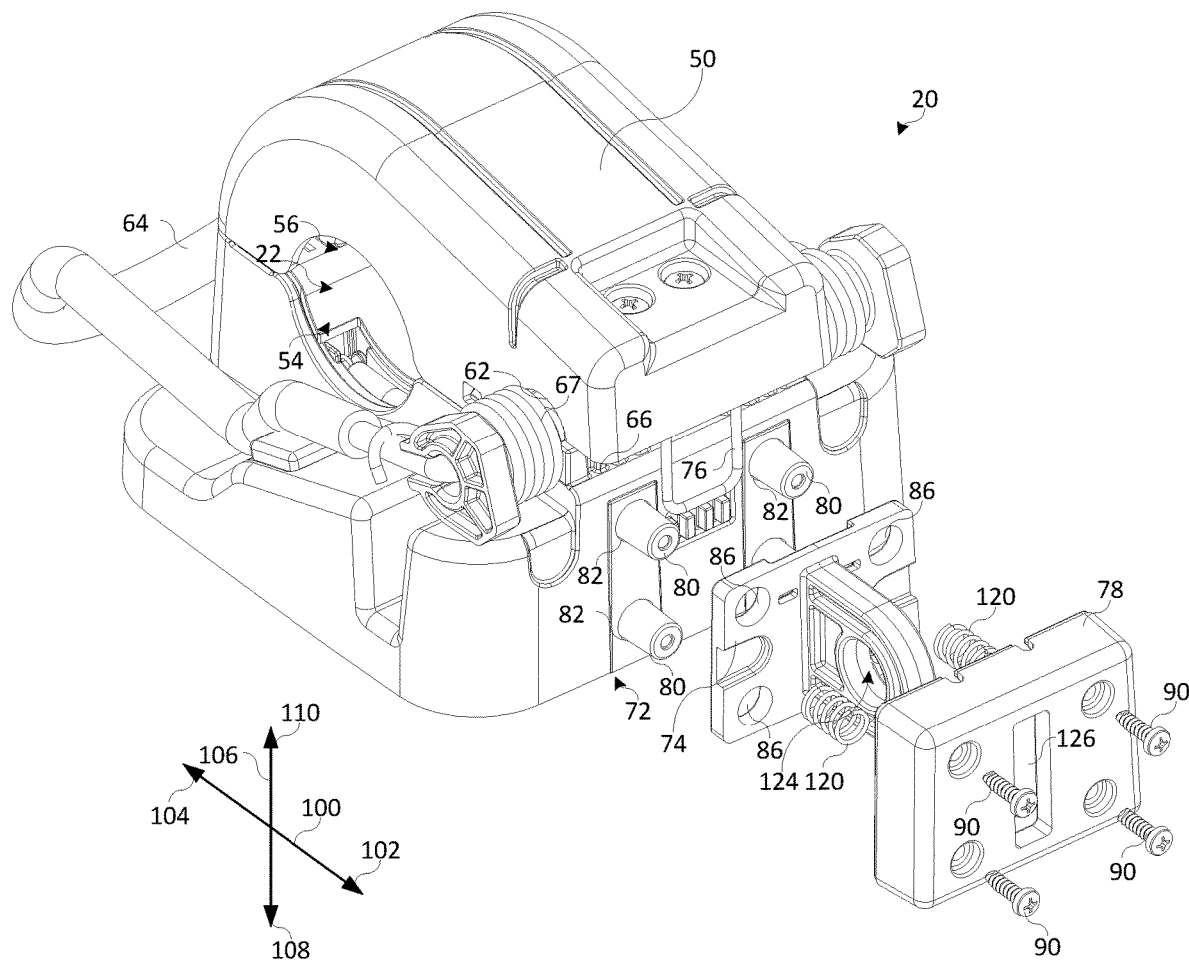
FIG. 3 is an exploded perspective view of the locking mechanism of FIG. 2, in accordance with an embodiment.

FIG. 3 is an exploded perspective view of the locking mechanism 70 of the FCI assembly 20. The locking mechanism 70 includes a back plate 72, a lock plate 74, a lock link 76, and a cover 78. In the illustrated embodiment, the back plate 72 includes one or more protrusions 80 that engage corresponding openings 82 of the second housing 52. The back plate 72 may be secured to the second housing 52 via push/press fit, fasteners, or any other suitable method. In another embodiment, the back plate 72 may be integrated as part of the second housing 52. Further, each of the protrusions 80 engage respective openings 86 of the lock plate 74. The cover 78 is fastened to the back plate 72 via fasteners 90 that fasten to the respective protrusions 80 of the back plate 72. By securing the lock plate 74 between the back plate 72 and the cover 78 via the openings 86 and the respective protrusions 80, the lock plate 74 may be movably coupled between the back plate 72 and the cover 78. That is, the openings 86 may engage the protrusions 80 such that the lock plate 74 may move along a lock-unlock axis 100. For instance, openings 86 and the protrusions 80 may enable linear movement of the lock plate along the protrusions such that the lock plate 74 may move between the back plate 72 and the cover 78 along the lock-unlock axis 100 but block lateral movement of the lock plate 74.

As explained in detail below, the lock plate 74 may selectively move in an unlock direction 102 (e.g., outwardly from the back plate 72) along the lock-unlock axis 100 to an unlocked position or move in a lock direction 104 (e.g., inwardly toward the back plate 72) along the lock-unlock axis 100 to a locked position. While the lock plate 74 is in the locked position, the lock plate 74 may block the lock link 76 from moving in an open direction 108 to prevent the FCI assembly 20 from opening and to secure the FCI assembly 20 in the closed position. While the lock plate 74 is in the unlocked position, the lock plate 74 may enable the lock link 76 to move along an open-close axis (e.g., an open direction 108 and/or a close direction 110) or otherwise move freely to allow the FCI assembly 20 to open.

The lock plate 74 may be biased towards the locked position via one or more biasing elements 120 (e.g., springs). While the biasing elements 120 are extended, the lock plate 74 may be in the locked position to limit movement of the lock link 76 (e.g., in the open direction 108). While the springs are compressed, the lock plate 74 is moved away from the lock link 76 and the lock link 76 may move freely (e.g., move freely in the open direction). The lock plate 74 may include an eyelet 124, and the cover 78 may include a corresponding opening 126 to enable the eyelet 124 to extend outwardly from the cover 78 to allow insertion of a hot stick within the eyelet 124. To control operation of the locking mechanism 70, an operator may insert a hot stick within the eyelet 124 and move the lock plate 74 along the lock-unlock axis 100 to compress the biasing elements 120 and to move the lock plate 74 to the unlocked position. While the lock plate 74 is in the unlocked position, the first housing 50 and the second housing 52 may move freely throughout the range of the hinge 62 due to the freedom of movement of the lock link.

Figure 4:
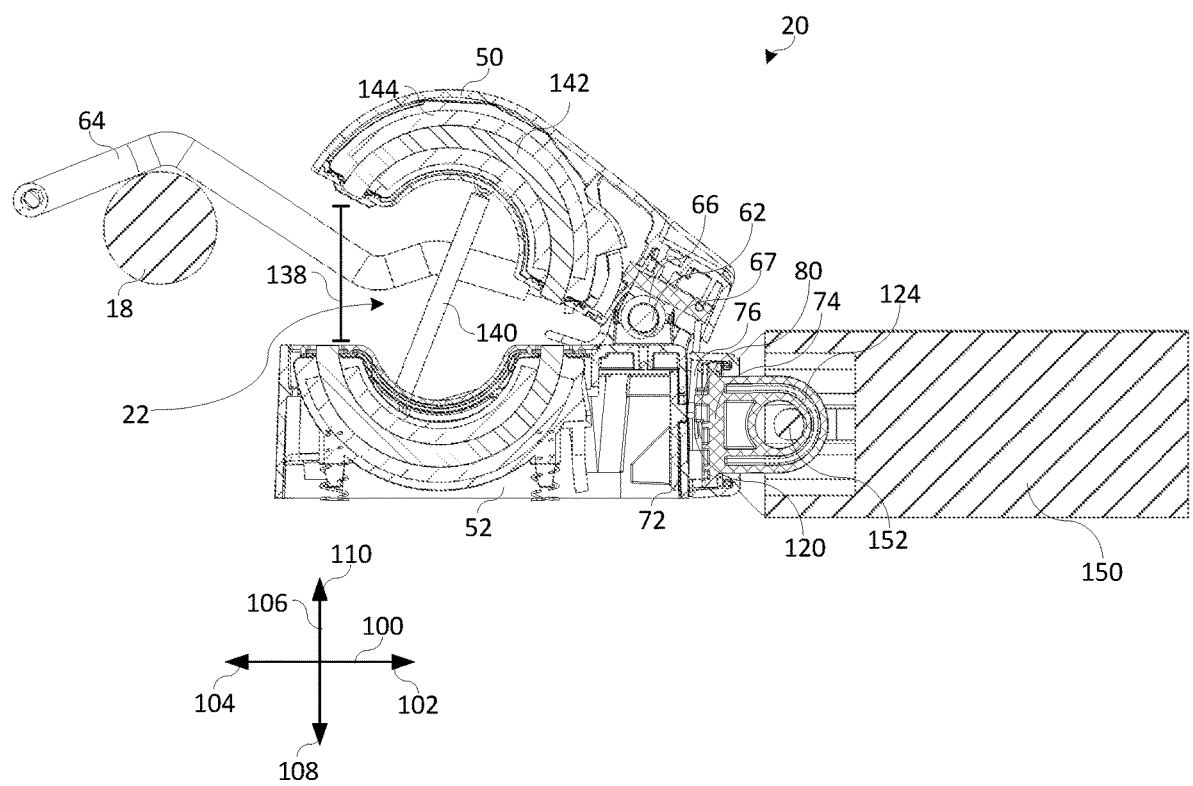
FIG. 4 is a cross-sectional view of the locking mechanism of FIG. 2 in an unlocked position during installation, in accordance with an embodiment.
Figure 5:
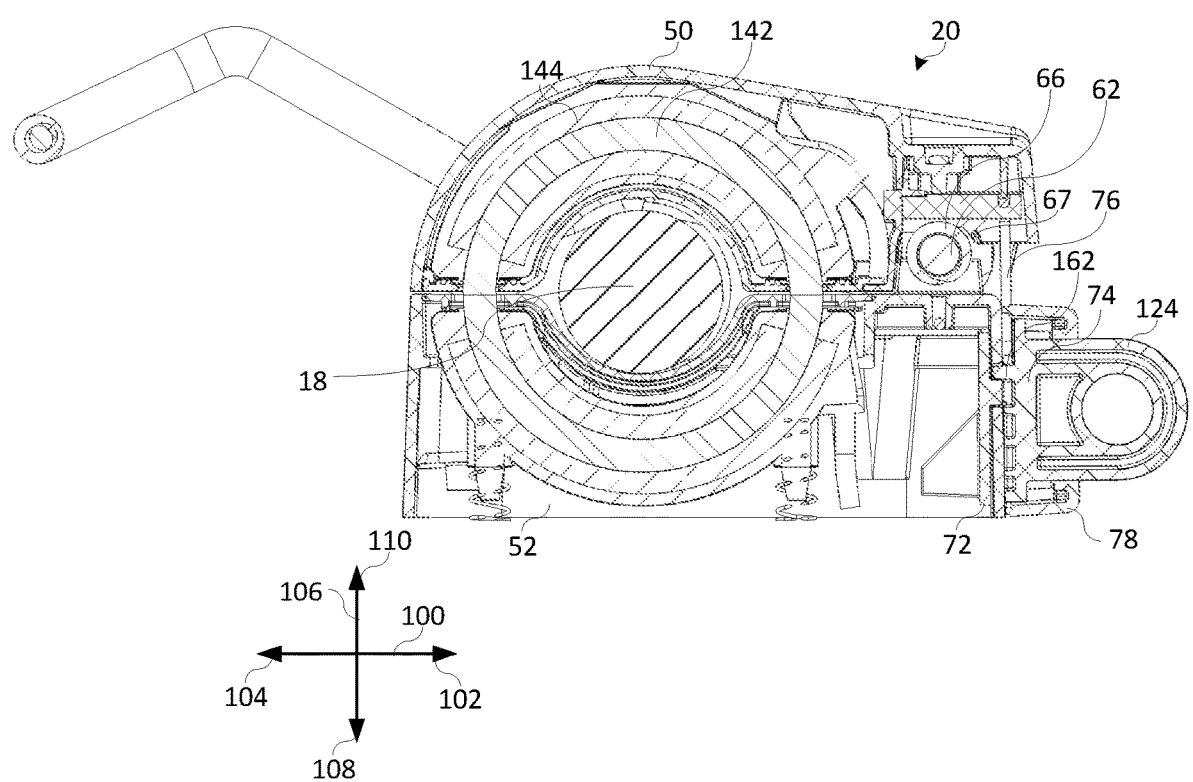
FIG. 5 is a cross-sectional view of the locking mechanism of FIG. 2 in a locked position after installation, in accordance with an embodiment.

FIG. 4 is a cross-sectional view of an embodiment of the FCI assembly 20 in the open position during installation. In the open position, the FCI assembly 20 may have a gap 138 between the first housing 50 and the second housing 52. The clamp bar 64 may guide the power line 18 through the gap 138 and into the opening 22 to install the FCI assembly 20 on the power line 18. A prop 140 may be positioned across the first housing 50 and the second housing 52 to hold the FCI assembly 20 in the open position, as shown in FIG. 5. The clamp bar 64 may guide the power line 18 towards the opening 22, and the power line 18 may trip the prop 140 to cause the torsion spring 66 to close the FCI assembly 20. The first housing 50 and the second housing 52 may each include halves of a split core 142 having one or more windings 144 of the current sensor 24. A hot stick 150 may include a hook 152 that engages the eyelet 124 to maintain the lock plate 74 in the unlocked position in which the lock plate 74 is extended outwardly from the back plate 72 towards the cover 78 in the unlock direction 102. While the lock plate 74 is in the unlocked position, the lock link 76 may move freely along the open-close axis 106, such as in the open direction 108 and/or the close direction 110. Upon closing the FCI assembly 20, the lock plate 74 may be moved to the locked position FIG. 5 is a cross-sectional view of an embodiment of the FCI assembly 20 in the closed position during operation (e.g., after installation). That is, the first housing 50 and the second housing 52 enclose the power line 18. As such, the current sensor 24 may receive a signal from the power line 18 indicative of current through the power line 18. As described below with respect to FIG. 7, the FCI assembly 20 may provide an indication of an event on the power line 18.

The locking mechanism 70 may be engaged in the locked position to lock the FCI assembly 20 in the closed position. For example, when the hot stick 150 is removed, the biasing element 120 may bias the lock plate 74 towards the locked position by expanding between the cover 78 and the lock plate 74. Upon expansion of the biasing element 120 in which the lock plate 74 is moved in the lock direction 104 to the locked position, a protrusion 162 of the lock plate 74 may block the lock link 76 from moving in the open direction 108 to prevent the FCI assembly 20 from opening. By engaging the locking mechanism 70, the gap 138 may be reduced or eliminated to block the power line 18 from exiting the opening 22. Further, by reducing or eliminating the gap 138, the annular profile of the split core may increasingly or entirely surround the power line 18 to improve current measurements via the current sensor 24 by better inductive coupling from the windings 144.

Figure 6:
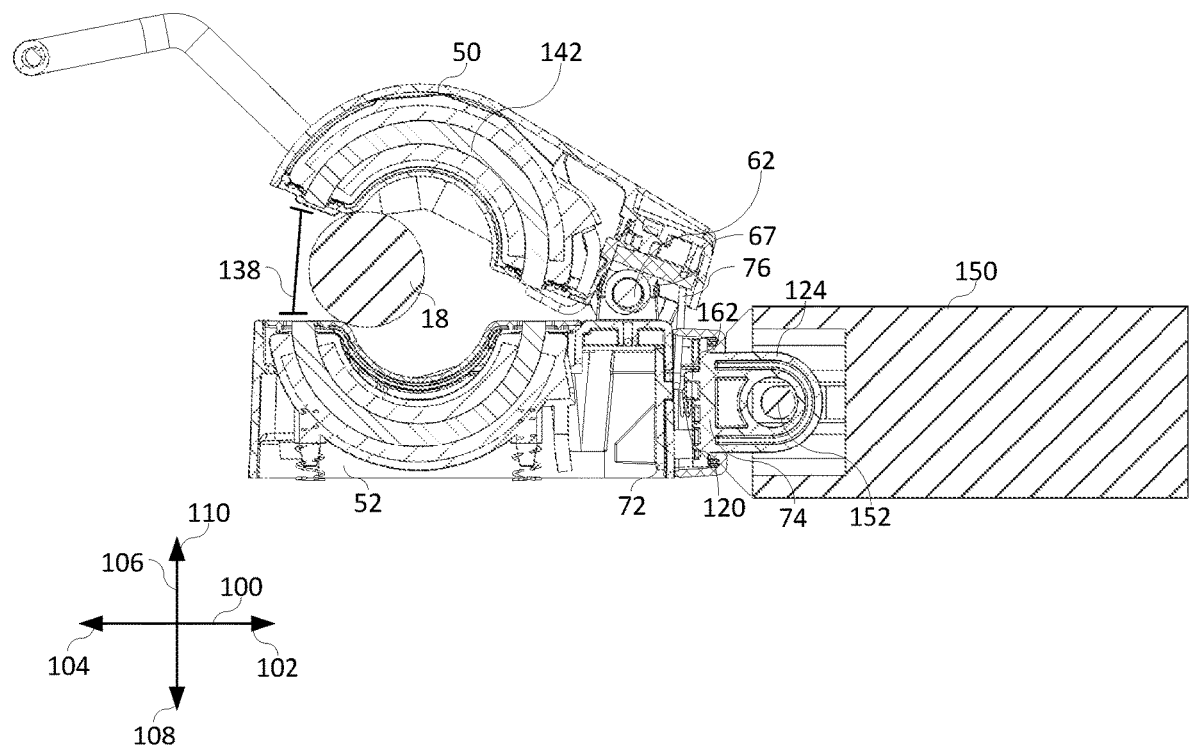
FIG. 6 is a cross-sectional view of the locking mechanism of FIG. 2 in the unlocked position during removal, in accordance with an embodiment.

FIG. 6 is a cross-sectional view of an embodiment of the FCI assembly 20 in the open position during removal of the FCI from the power line. During removal, the operator may insert the hot stick 150 into the eyelet 124. Upon moving the lock plate 74 to the unlocked position shown in FIG. 6, the lock link 76 may move freely in the open direction 108 (e.g., below the protrusion 162). The operator may pull on the hot stick 150 to remove the FCI assembly 20 from the power line. The power line 18 may be guided up the clamp bar and out the gap 138 between the first housing 50 and the second housing 52.

Figure 7:
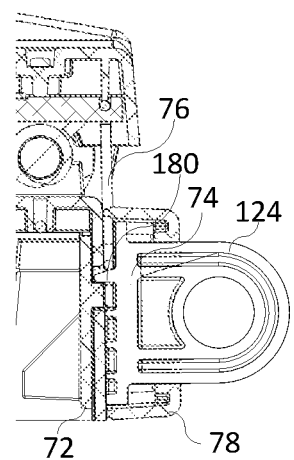
FIG. 7 is a cross-sectional view of another example of the locking mechanism of FIG. 2, in accordance with an embodiment.

FIG. 7 is a cross-sectional view of another embodiment of the FCI assembly 20. According to one embodiment, the lock plate 74 may include a ramped protrusion 180 that allows for tolerance between differently sized lock links 76. That is, if the lock link 76 is sized larger or smaller, for example, due to tolerances in the manufacturing of the lock link 76, the ramped protrusion 180 may prevent the lock link 76 from moving in the open direction 108. The ramped protrusion 180 may further allow the bias springs to provide a closing force on the lock link 76.

Figure 8:
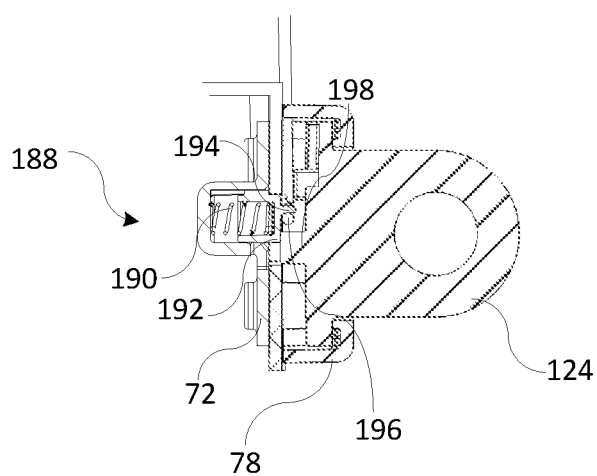
FIG. 8 is a cross-sectional view of another example of the locking mechanism of FIG. 2, in accordance with an embodiment.

FIG. 8 is a cross-sectional view of another embodiment of the FCI assembly 20. As another example, the back plate 72 may be coupled to a catch spring assembly 188 that maintains the FCI assembly 20 in the open position during installation. The catch spring assembly 188 may include a catch spring 190 and a catch 192. During installation, the catch 192 may secure the lock link 76 below a protrusion 194 of the catch 192 at a location 196 to maintain the lock link 76 in the unlocked position. After installation (e.g., during operation), the lock plate 74 compresses the catch spring 190 via the catch 192 and the lock link 76 is positioned in the lock position, as described above with respect to FIG. 5. The lock plate 74 includes an additional protrusion 198 that pushes on the catch 192 to release the link and close the FCI assembly 20. In some embodiments, the catch spring assembly 188 may be used to maintain the FCI assembly 20 in the open position during installation in place of or in addition to the prop 140.

Figure 9:
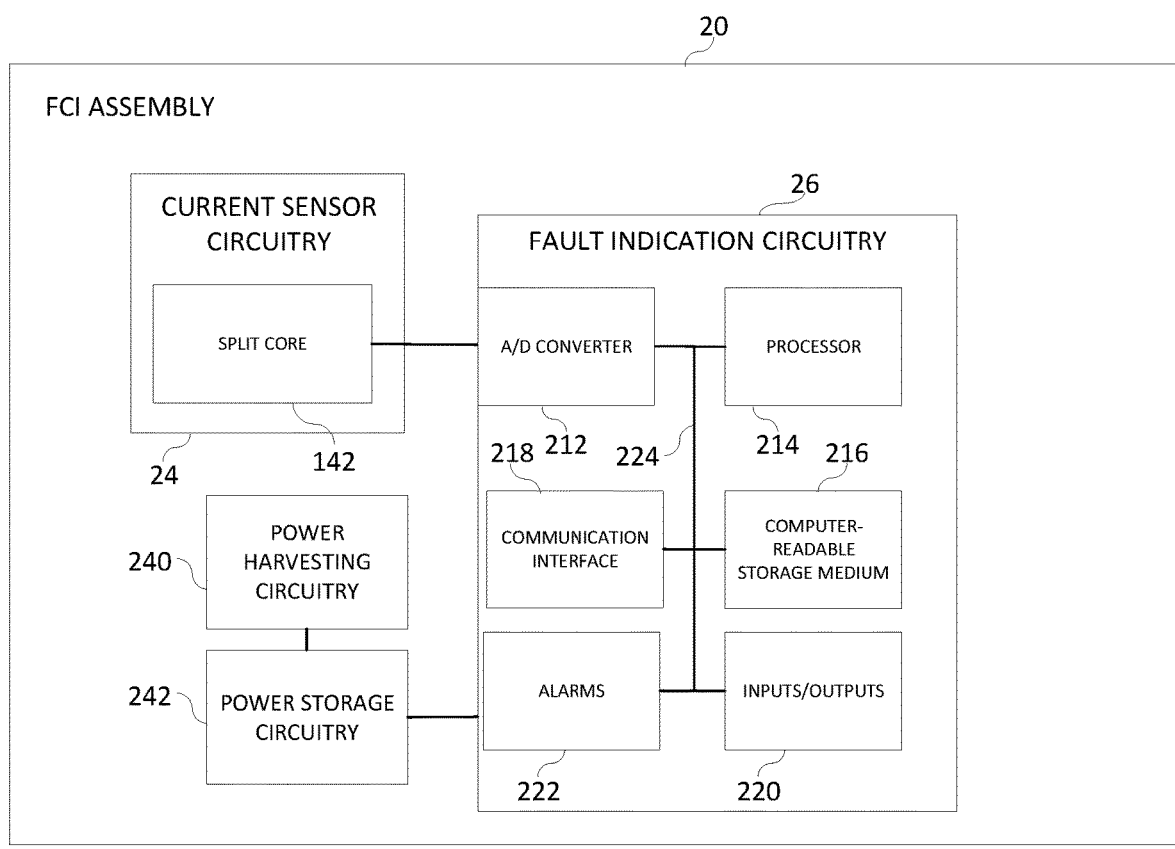
FIG. 9 is a block diagram of a control system for the FCI of FIG. 1, in accordance with an embodiment.

FIG. 9 is a block diagram of a monitoring system for the FCI assembly 20 to enable the FCI assembly 20 to provide an indication of an event. The FCI assembly 20 may include fault indication circuitry 26, such as a controller or microcontroller, operatively coupled the split core 142. The controller may include an analog-to-digital (ND) converter 212 that receives analog signals from the current sensor circuitry 24 on the power line and converts those signals into digital signals. The controller may include one or more processors 214, one or more computer-readable storage mediums 216, a communication interface 218, one or more inputs/outputs 220, one or more alarms 222, or any combination thereof. Each of the processor 214, the computer-readable storage medium 216, the communication interface 218, the inputs/outputs 220, and the alarms 222 may be communicatively coupled to one or more communication buses 224.

The computer-readable storage 216 may be any suitable non-transitory computer-readable storage medium, such as memory. The memory may be a repository of one or more executable instructions (e.g., code) to implement any of the processes described herein. In some embodiments, the computer-readable storage medium may be implemented as hardware components, such as via discrete electrical components, via a field programmable gate array (FPGA), and/or via one or more application specific integrated circuits (ASICs). The processor 214 may be configured to process data received from the current sensor circuitry 24. The processor 214 may be embodied as a general purpose integrated circuit, an ASIC, an FPGA, and/or other programmable logic devices.

The A/D converter may multiplex, sample, and/or digitize the measured current and/or voltage signals to form corresponding digitized current and/or voltage signals. For example, the A/D converter 212 may monitor current signals associated with the power line 18. Further the ND converter 212 may be operatively coupled to the processor 214 via the communication bus 224, through which digitized representations of current and/or voltage signals may be transmitted to the processor 214. The processor 214 may determine an occurrence of an event based on the digitized representations of current using instructions stored in the memory 216. For example, the processor 214 may determine whether the current detected via the current sensor circuitry 24 exceeds a threshold current. The processor 214 may then provide a signal indicating the occurrence of the event. For instance, the processor 214 may send a signal to the communication interface 218 to output a wireless signal to an electronic device to indicate that the event has occurred or is ongoing. Further, the processor 214 may send a signal to the alarm 222 to cause the alarm 222 to indicate that the event. The alarm 222 may provide an audio alert, a visual alert (e.g., LEDs), or the like. The FCI assembly 20 may include power harvesting circuitry 240 (e.g., current transformers coupled to the power line 18, photovoltaic cells, etc.) as well as power storage circuitry 242, such as one or more batteries, supercapacitors, or the like. The power harvesting circuitry 240 may harvest power, for example, from the current transformer, one or more photovoltaic cells, or the like. The power harvesting circuitry 240 may provide power to the power storage circuitry 242 to store energy to power the fault indication circuitry 26.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function]. . ." or "step for [perform]ing [a function]. . .", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A faulted circuit indicator (FCI) assembly, comprising:
   current sensor circuitry;
   a first housing and a second housing, wherein the first housing and the second housing are configured to enable a power line to be inserted therebetween while in an open position and to enclose the power line therebetween while in a closed position, wherein the first housing and the second housing each comprise at least a portion of the current sensor circuitry; and
   a locking mechanism comprising:
      a lock link;
      a lock plate configured to selectively block the lock link to prevent the first housing and the second housing from moving to the open position while the locking mechanism is in a locked position, wherein the lock plate is configured to enable the lock link to move with respect to the lock plate while the locking mechanism is in an unlocked position;
      a back plate;
      a cover configured to be fastened to the back plate; and
      a biasing member configured to be positioned between the lock plate and the cover, wherein the biasing member is configured to be compressed to move the lock plate to the unlocked position.

2. The FCI assembly of claim 1, wherein the lock plate is biased, via the biasing member, towards the locked position.

3. The FCI assembly of claim 1, wherein the lock plate comprises a ramped lock surface to allow a tolerance in positioning the lock plate in the locked position.

4. The FCI assembly of claim 1, wherein the lock link is configured to move in a first direction and a second direction, and wherein the lock plate is configured to move in a third direction and a fourth direction, orthogonal to the first direction and the second direction.

5. The FCI assembly of claim 1, comprising a catch spring assembly configured to catch the lock link to maintain the lock mechanism in the unlocked position during installation.

6. The FCI assembly of claim 1, wherein the back plate comprises a plurality of protrusions and the lock plate comprises a plurality of respective apertures, wherein the plurality of protrusions and plurality of respective apertures enable linear movement of the lock plate along the protrusions between the back plate and the cover but block lateral movement between the back plate and lock plate.

7. The FCI assembly of claim 1, wherein the locking mechanism is configured to reduce or eliminate a gap between the first housing and the second housing to increase or maintain an annular profile of windings of the current sensor that encloses the power line to improve inductive coupling of the windings to the power line.

8. The FCI assembly of claim 1, comprising a hinge configured to rotationally couple the first housing and the second housing with respect to each other, wherein the FCI assembly comprises a torsion spring configured to bias the first housing and the second housing towards the closed position.

9. The FCI assembly of claim 1, comprising fault indication circuitry configured to provide a signal indicative of an event.

10. The FCI assembly of claim 1, wherein the current sensor circuitry comprises a split core of windings.

11. A locking assembly for a faulted circuit indicator (FCI), comprising:
    a lock link configured to be coupled to a first housing of the FCI, and
    a lock plate configured to selectively move between a locked position and an unlocked position, wherein, when in the locked position, the lock plate is configured to block a lock link of the FCI from moving in a first direction to prevent the FCI from opening, and wherein, when in the unlocked position, the lock plate is configured to enable the lock link of the FCI to move in the first direction to allow the FCI to open;
    wherein the lock link is configured to move in the first direction, lateral to a second housing of the FCI, to open the FCI and a second direction, lateral to the second housing of the FCI, to close the FCI, and wherein the lock plate is configured to move in a third direction to the locked position and a fourth direction to the unlocked position, wherein the third direction and the fourth direction are orthogonal to the first direction and the second direction and move radially with respect to the second housing.

12. The locking assembly of claim 11, comprising a back plate and a cover configured to be coupled to each other with the lock plate therebetween.

13. The locking assembly of claim 11, comprising a catch spring assembly configured to catch the lock link to maintain the lock plate in the unlocked position during installation.

14. A faulted circuit indicator (FCI) assembly, comprising:
    current sensor circuitry;
    a first housing and a second housing, wherein the first housing and the second housing are configured to enable a power line to be inserted therebetween while in an open position and to enclose the power line therebetween while in a closed position, wherein the first housing and the second housing each comprise at least a portion of the current sensor circuitry; and
    a locking mechanism comprising:
       a lock link;
       a lock plate configured to selectively block the lock link to prevent the first housing and the second housing from moving to the open position while the locking mechanism is in a locked position, wherein the lock plate is configured to enable the lock link to move with respect to the lock plate while the locking mechanism is in an unlocked position; and
       a catch spring assembly configured to catch the lock link to maintain the lock mechanism in the unlocked position during installation.

15. The FCI assembly of claim 14, wherein the catch spring assembly comprises a catch configured to secure the lock link below a protrusion of the catch to maintain the first housing and the second housing in the open position.

16. The FCI assembly of claim 14, wherein the lock link is configured to move in a first direction and a second direction, and wherein the lock plate is configured to move in a third direction and a fourth direction, orthogonal to the first direction and the second direction.

17. The FCI assembly of claim 14, wherein the lock plate is biased, via the biasing member, towards the locked position.

18. The FCI assembly of claim 14, wherein the lock plate comprises a ramped lock surface to allow a tolerance in positioning the lock plate in the locked position.

19. The FCI assembly of claim 14, comprising a hinge configured to rotationally couple the first housing and the second housing with respect to each other, wherein the FCI assembly comprises a torsion spring configured to bias the first housing and the second housing towards the closed position.

20. The FCI assembly of claim 14, wherein the catch spring assembly comprises a catch spring, wherein the lock plate is configured to compress the catch spring upon installation of the FCI.

* * * * *